US007000163B1

(12) United States Patent
Dirks et al.

(10) Patent No.: US 7,000,163 B1
(45) Date of Patent: Feb. 14, 2006

(54) OPTIMIZED BUFFERING FOR JTAG BOUNDARY SCAN NETS

(75) Inventors: Juergen Dirks, Santa Clara, CA (US); Juergen K. Lahner, Sunnyvale, CA (US); Ludger F. Johanterwage, Los Gatos, CA (US); Benjamin Mbouombouo, San Jose, CA (US); Human Boluki, Munich (DE); Weidan Li, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 391 days.

(21) Appl. No.: 10/082,737

(22) Filed: Feb. 25, 2002

(51) Int. Cl.
*G01R 31/28* (2006.01)

(52) U.S. Cl. .......................... 714/727; 716/1; 703/19; 438/18; 324/763

(58) Field of Classification Search ................ 714/727, 714/726, 729; 716/16
See application file for complete search history.

(56) References Cited

U.S. PATENT DOCUMENTS

| | | | | |
|---|---|---|---|---|
| 4,912,709 A | * | 3/1990 | Teske et al. ................. 714/724 |
| 5,307,286 A | * | 4/1994 | Rusu et al. .................... 716/17 |
| 5,717,700 A | * | 2/1998 | Crouch et al. ............... 714/726 |
| 5,831,993 A | | 11/1998 | Graef | |
| 5,887,004 A | * | 3/1999 | Walther ....................... 714/726 |
| 5,907,562 A | * | 5/1999 | Wrape et al. ................ 714/726 |
| 6,240,536 B1 | * | 5/2001 | Mikan et al. ................ 714/727 |
| 6,362,015 B1 | * | 3/2002 | Whetsel ....................... 438/18 |
| 6,381,719 B1 | * | 4/2002 | Scheck ......................... 714/727 |
| 6,539,509 B1 | * | 3/2003 | Teene .......................... 714/727 |
| 6,615,402 B1 | * | 9/2003 | Kaneko et al. ............... 716/16 |
| 6,646,460 B1 | * | 11/2003 | Whetsel ....................... 324/763 |
| 6,708,144 B1 | * | 3/2004 | Merryman et al. ........... 703/14 |
| 6,721,923 B1 | * | 4/2004 | Fisher ........................... 716/1 |

\* cited by examiner

*Primary Examiner*—Albert Decady
*Assistant Examiner*—John P. Trimmings
(74) *Attorney, Agent, or Firm*—Christopher P. Maiorana, P.C.

(57) ABSTRACT

An apparatus comprising one or more groups of boundary scan cells, one or more group buffers, one or more repeater buffers and a controller. The group buffers may be coupled to each of the groups of boundary scan cells. The repeater buffers may be coupled in series with the group buffers. The controller may be coupled to the groups of boundary scan cells through the group buffers and the repeater buffers. The apparatus may be configured to buffer the groups of boundary scan cells to reflect an order of I/Os around the apparatus.

16 Claims, 7 Drawing Sheets

FIG. 1

FIG. 2 (CONVENTIONAL)

OPTIMIZED BUFFERING FOR JTAG BOUNDARY SCAN NETS

FIELD OF THE INVENTION

The present invention relates to a method and/or architecture for improving implementing JTAG boundary scan control nets generally and, more particularly, to a method and/or architecture for (i) reducing the area which is needed for the net routing and (ii) controlling placement of wires on the die after final layout is completed.

BACKGROUND OF THE INVENTION

Figure 1:
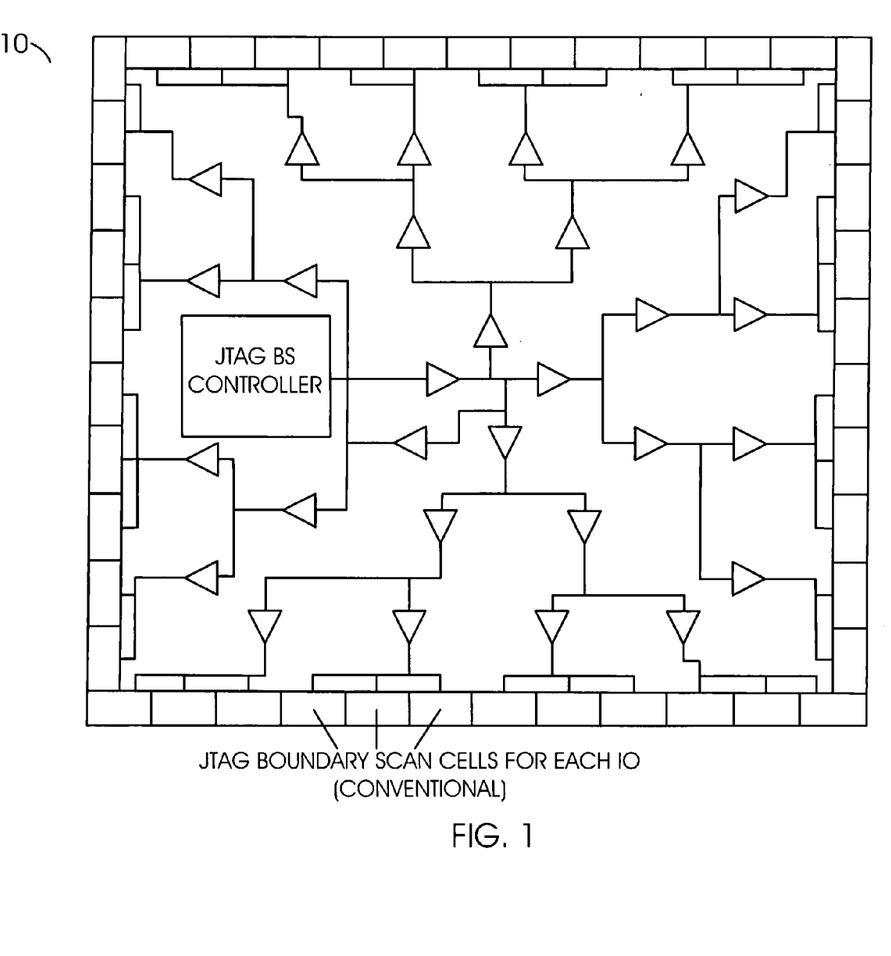
FIG. 1 is a block diagram of a conventional JTAG boundary scan net.

Referring to FIG. 1, a conventional JTAG boundary scan control signal routing of an application specific integrated circuit (ASIC) 10 is shown. The JTAG signal routing of the ASIC 10 is buffered in a tree structure. The starting point for the tree is typically located somewhere in the center region of the die. In some instances the JTAG boundary scan gates can be placed elsewhere manually. From the starting point the trees fan out to all different sides of the ASIC 10. Therefore, the ASIC 10 will have JTAG boundary scan signal buffers all over the die. Also, routes will go through the center of the die. Because there are several control nets which can go to each I/O cell (not shown, surrounding the ASIC 10), uncontrolled routing occurs and increases congestion problems.

Conventional approaches manually place JTAG boundary scan gates before routing in an attempt to reduce unnecessary routing. However, current netlists which go into layout do not contain sufficient buffering of the high fanout JTAG boundary scan control nets. Therefore, insertion of buffers is done by layout tools based on distances, maximum ramp times or similar requirements, but never driven by the order of I/Os. The result of the buffering is a tree structure across the die. Furthermore, each design has to be handled individually, since no common solution exists.

Conventional boundary scan methodologies are used to test I/Os (i.e., input/output circuitry to connect a chip to the external world) on silicon. There is a set of required boundary scan cells for every set of I/Os to be tested. The boundary scan cells can be placed by a placement tool (or manually in front of the respective I/Os to avoid any timing issues). Flip flops (not shown) in the scan chain are then connected together as a register chain. The placement tool can place the boundary scan cells far away from the respective I/Os, particularly when memories (or other dedicated blocks) are placed in front of the I/Os.

Figure 2:
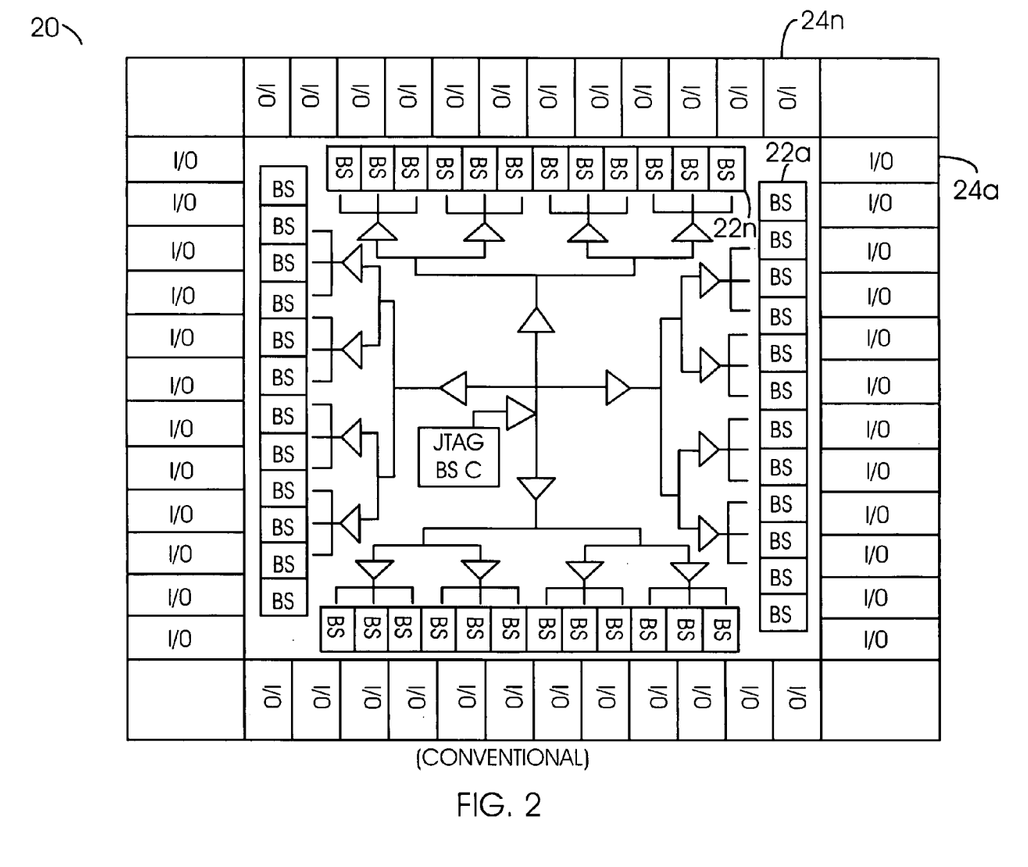
FIG. 2 is a block diagram of a typical boundary scan connection with boundary cells outside the I/O cells.

Referring to FIG. 2, a circuit 20 is shown illustrating a conventional boundary scan connection with the boundary scan cells 22a–22n outside the I/O cells 24a–24n. Trying to connect the boundary scan cells 22a–22n, which are scattered over the entire die, can cause timing problems. Since the boundary scan flip flops are connected in a chain, routing issues cause severe hold time violations, thereby causing the chain to fail. However, placing the boundary scan cells 22a–22n manually is very time consuming (there typically exist hundreds of cells in a single device). For example, the manual placement process can take a number of days in a standard size design. Additionally, there is a clock tree at the top level to clock the boundary scan flip flops. Therefore, managing a reasonable skew at chip level is challenging, time consuming and area consuming. Furthermore, since more I/O cells are continually being added inside the I/O devices, timing modeling of the I/O devices need to be constantly updated.

SUMMARY OF THE INVENTION

The present invention concerns an apparatus comprising one or more groups of boundary scan cells, one or more group buffers, one or more repeater buffers and a controller. The group buffers may be coupled to each of the groups of boundary scan cells. The repeater buffers may be coupled in series with the group buffers. The controller may be coupled to the groups of boundary scan cells through the group buffers and the repeater buffers. The apparatus may be configured to buffer the groups of boundary scan cells to reflect an order of I/Os around the apparatus.

The objects, features and advantages of the present invention include providing a method and/or architecture for implementing optimized buffering for JTAG boundary scan nets that may (i) buffer scan nets in a way which reflects the order of the I/Os around the die, (ii) allow buffering cell placement and net routing tools to achieve optimal results automatically, (iii) provide universal JTAG boundary scan designs, (vi) implement boundary scan cells inside the I/O cells, (v) implement boundary scan flip flops without a clock tree, (vi) meet hold times for the boundary scan chain, (vii) reduce crosstalk and noise impact of the scan connection, (viii) improve flip flop performance, (ix) provide power savings, (x) reduce turnaround time, and/or (xi) have no additional area cost.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
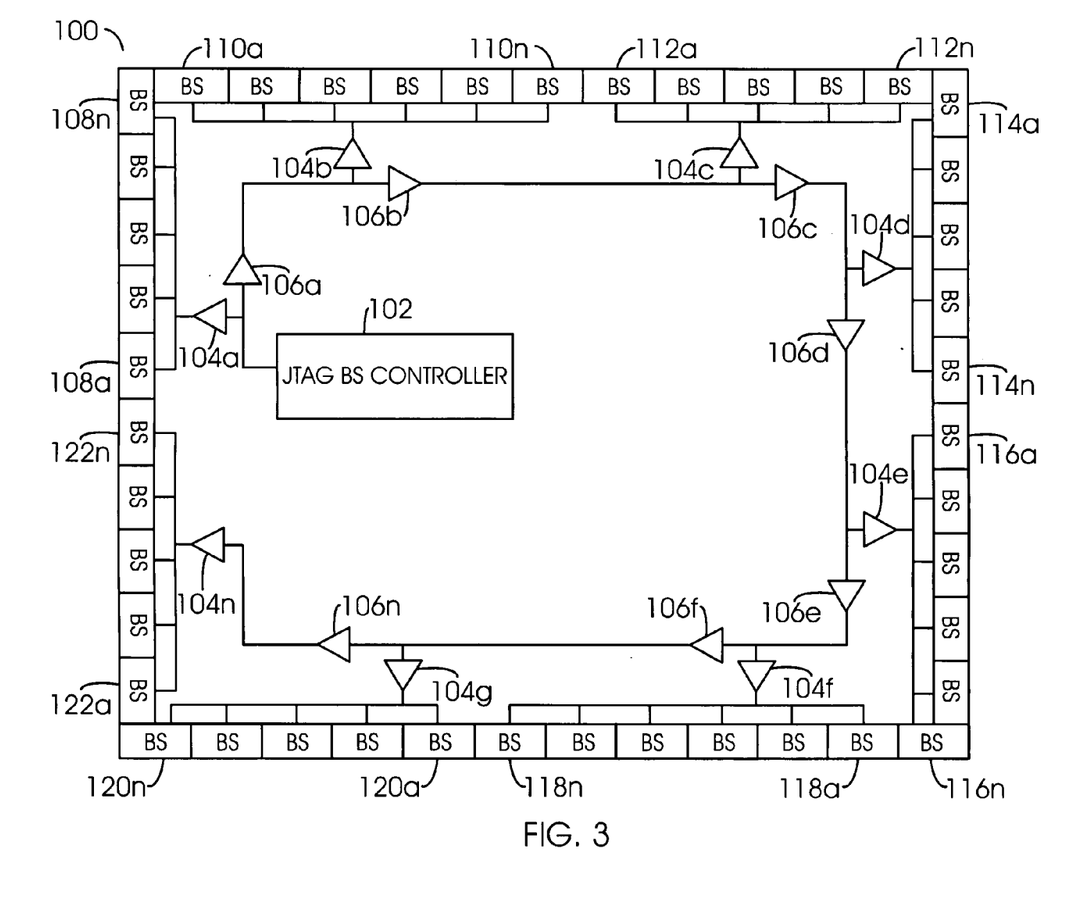
FIG. 3 is a block diagram of a preferred embodiment of the present invention.

Referring to FIG. 3, a block diagram of a system (or circuit) 100 is shown in accordance with a preferred embodiment of the present invention. The circuit 100 may be configured to improve the overall routing of JTAG boundary scan control nets in an ASIC design. The circuit 100 may be configured to reduce the area which is needed for the net routing and to provide control of where wires will be located on the die after final layout is completed. The system 100 may be configured to optimize buffering for JTAG boundary scan nets. An example of a JTAG boundary scan net may be found in the IEEE Standard Test Access Port and Boundary-Scan Architecture, published Feb. 15, 1990 and revised on Jun. 17, 1993, which is hereby incorporated by reference in its entirety.

The system 100 generally comprises a JTAG boundary scan controller 102, a number of buffers 104a–104n, a number of buffers 106a–106n, a number of cells 108a–108n, a number of cells 110a–110n, a number of cells 112a–112n, a number of cells 114a–114n, a number of cells 116a–116n and a number of cells 118a–118n, a number of cells 120a–120n and a number of cells 122a–122n. The buffers 104a–104n may be implemented as group buffers. In one example, the cells 108–122 may be implemented as boundary cells. The buffers 106a–106n may be implemented as repeater buffers. In another example, the cells 108–122 may be implemented as JTAG boundary scan cells.

The controller 102 may be coupled in series with the buffers 104a–104n via the buffers 106a–106n. The buffer 104a may be coupled to the I/O cells 108a–108n. The buffer 106a may be coupled in series between the buffer 104a and the buffer 104b. The buffer 104b may be coupled to the cells 110a–110n. The buffer 106b may be coupled in series between the buffer 104b and the buffer 104c. The buffer 104c may be coupled to the cells 112a–112n. The buffer 106c may be coupled in series between the buffer 104c and the buffer 104d. The buffer 104d may be coupled to the cells 114a–114n. The buffer 106d may be coupled in series between the buffer 104d and the buffer 104e. The buffer 104e may be coupled to the cells 116a–116n. The buffer 106e may be coupled in series between the buffer 104e and the buffer 104f. The buffer 104f may be coupled to the cells 118a–118n. The buffer 106f may be coupled in series between the buffer 104f and the buffer 104g. The buffer 104g may be coupled to the cells 120a–120n. The buffer 106n may be coupled in series between the buffer 104g and the buffer 104n. The buffer 104n may be coupled to the cells 122a–122n.

The system 100 may have a netlist generated in a way such that the repeater buffers 106a–106n for the JTAG boundary scan control nets do not fan out as a balanced tree, but in a chain which goes around the die, following the order of the cells 108, 110, 112, 114, 116, 118, 120 and 122. The circuit 100 may buffer the JTAG boundary scan nets (e.g., the blocks 108, 110, 112, 114, 116, 118, 120 and 122) as a chain. The chain configuration of the circuit 100 may complete routing of the nets 108, 110, 112, 114, 116, 118, 120 and 122 in the I/O region of the die. Therefore, the center region of the circuit 100, which usually contains the congestion problems, is kept free for functional signal routing. The repeater buffers 106a–106n have been added to the group buffers 104a–104n to reduce and/or eliminate potential skew problems between pins at the beginning of the chain and pins at the end of the chain.

Figure 4:
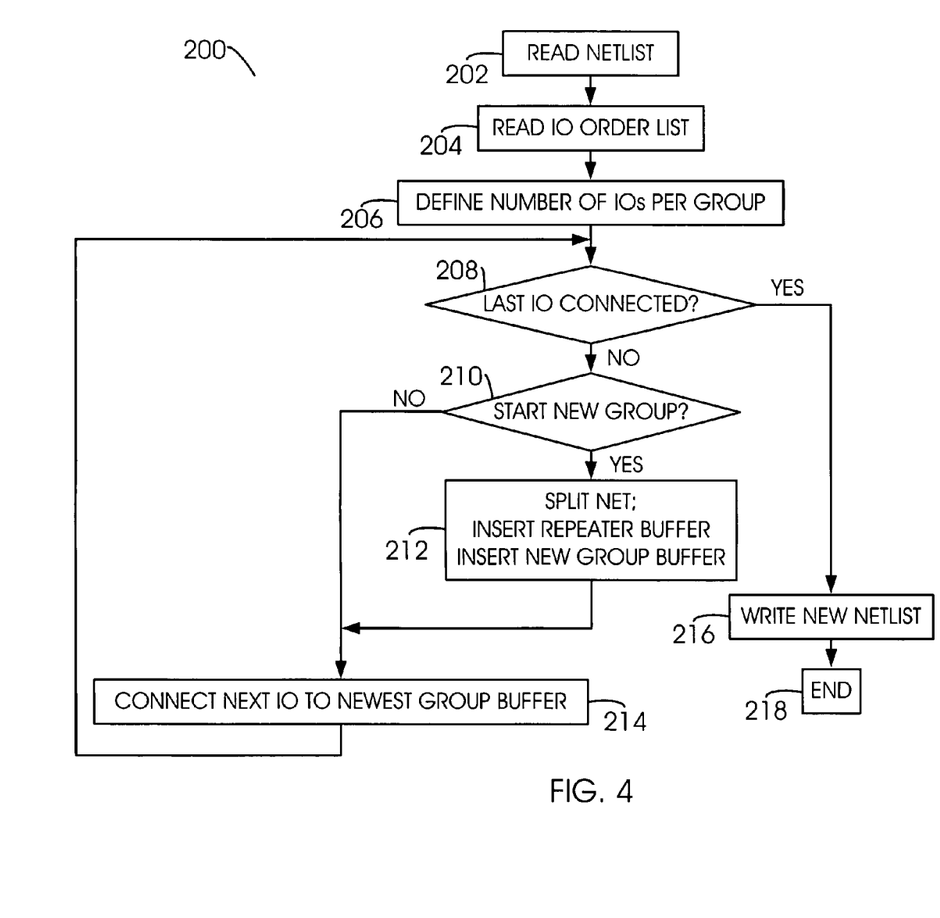
FIG. 4 is a flow chart illustrating an operation of the present invention.

Referring to FIG. 4, a method (or process) 200 is shown. The process 200 may be configured to insert the buffers 104 and 106 for JTAG boundary scan nets. The process 200 generally comprises a state 202, a state 204, a state 206, a decision state 208, a decision state 210, a state 212, a state 214, a state 216 and a state 218. While in the state 202, the process 200 may read the netlist. While in the state 204, the process 200 may read the I/O order list. While in the state 206, the process 200 may define the number of I/Os per group. While in the state 208, the process 200 may determine if the last I/O is connected. If the last I/O is not connected, the process 200 may continue to the decision state 210.

While in the decision state 210, the process 200 may determine if a new group is to be started. If a new group is to be started, the process 200 may continue to the state 212. While in the state 212, the process 200 may (i) split the net, (ii) insert a repeater buffer (e.g., the buffers 106a–106n) and (iii) insert a new group buffer (e.g., the buffers 104a–104n). The process 200 may then proceed to the state 214. Returning to the decision state 210, if a new group is not started, the process 200 may also continue to the state 214.

While in the state 214, the process 200 may connect the next I/O to the newest group buffer. The process 200 may then return to the decision state 208. The decision state 208 of the process 200 may be configured to repeat the states 210–214 or if the last I/O is connected, continue to the state 216. While in the state 216, the process 200 may write a new netlist. The process 200 may then continue to the end state 218.

The processor 200 may allow the JTAG boundary scan control nets 108–122 to be buffered in a way which reflects the order of the I/Os around the die. The process 200 may provide (i) JTAG boundary scan control net buffering, (ii) boundary scan cell placement and (iii) net routing tools to achieve optimal results automatically. The process 200 may not need extra manual work to eliminate JTAG fanout nets. The method 200 may also allow each design that contains JTAG boundary scan to be processed in a similar manner.

Figure 5:
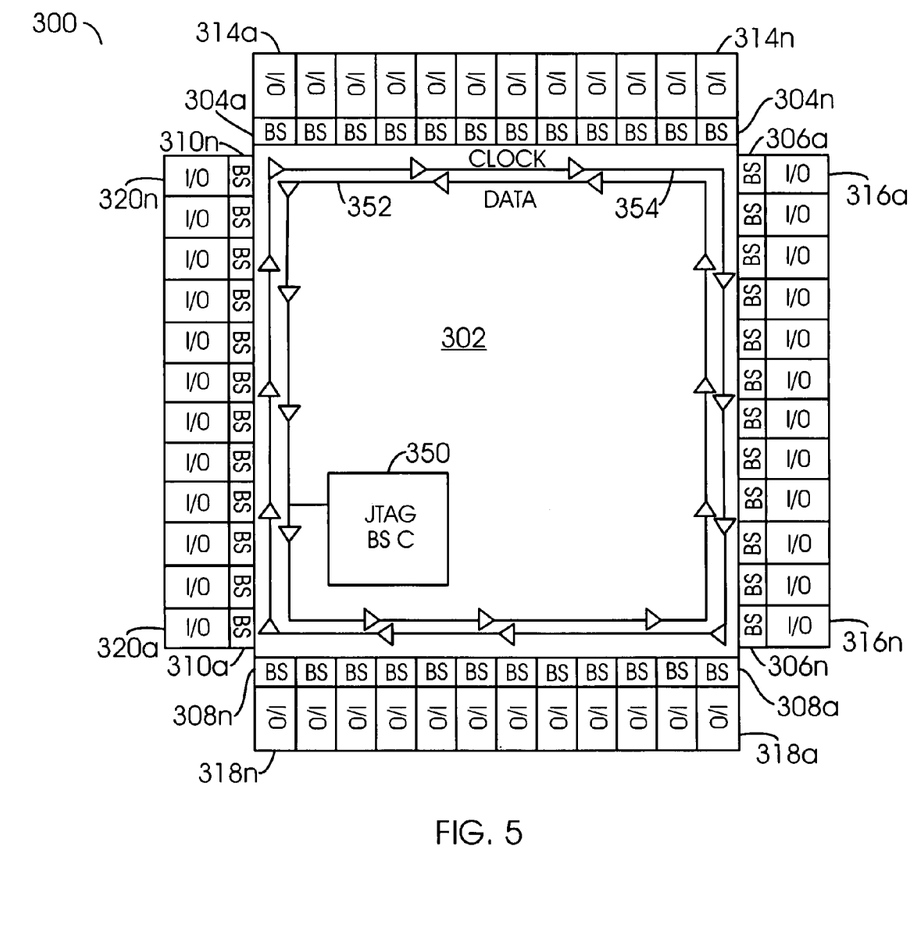
FIG. 5 is a block diagram of a boundary scan connection in conjunction with the present invention.

Referring to FIG. 5, a circuit 300 is shown illustrating an implementation of the present invention. The circuit 300 generally comprises a block (or circuit) 302, a number of boundary scan cells 304a–304n, a number of boundary scan cells 306a–306n, a number of boundary scan cells 308a–308n, a number of boundary scan cells 310a–310n, a number of I/O cells 314a–314n, a number of I/O cells 316a–316n, a number of I/O cells 318a–318n and a number of I/O cells 320a–320n. The circuit 302 may also have a boundary scan controller 350, a data chain 352 and a clock chain 354.

Each of the boundary scan cells 304a–304n may be implemented within the I/O cells 314a–314n, respectively. Each of the boundary scan cells 306a–306n may be implemented within the I/O cells 316a–316n, respectively. Each of the boundary scan cells 308a–308n may be implemented within the I/O cells 318a–318n, respectively. Each of the boundary scan cells 310a–310n may be implemented within the I/O cells 320a–320n, respectively.

The circuit 300 may implement the boundary scan cells 304, 306, 308, 310 inside each of the I/Os 314, 316, 318 and 320. Such a configuration may increase turnaround time, solve placement issues, and save timing issues. With all the scan cells 304, 306, 308 and 310 inside the I/Os 314, 316, 318 and 320, the datashift chain 352 may be a default connection from I/O to I/O. The clock chain 354 may be routed from I/O to I/O in the opposite direction to the datashift chain 352. Therefore, no clock tree may be needed. The configuration of the circuit 300 may provide efficient hold times. Furthermore, every I/O cell 314, 316, 318 and 320 may provide the necessary pins to connect the boundary scan cells 304, 306, 308 and 310.

The circuit 300 may allow the I/Os 314–320 to include all the boundary scan cells 304–310. The input boundary scan cells 304–310 may be implemented in the input buffers (not shown) within the I/O cells 314–320. The I/Os 314–320 may be configured to provide pins from the input boundary scan cells 314–320 to the core logic 302. The output boundary scan cells 304–310 may be implemented in the output buffers (not shown) within the I/O cells 314–320. The I/O 314–320 may be configured to provide pins from the output boundary scan cells 304–310 to the core logic 302. The bidirectional buffers (not shown) within the I/O cells may also include the bidirectional boundary scan cells 304–310. The I/Os 314–320 may be configured to provide all pins from the bidirectional boundary scan cells 304–310 to the core logic 302. The test access port (TAP) controller block and the remaining JTAG logic (not shown) may be on-chip (e.g., outside the I/Os).

The circuit 300 may allow boundary scan cells inside the I/Os. The circuit 300 may not need a clock tree for the boundary scan flip flops. The circuit 300 may be configured to meet hold time for the boundary scan chain. The circuit 300 may allow reduced turnaround time. For example, possible manual placement of boundary scan cells or manual hold time fixes are not needed. The circuit 300 may not need a clock tree for the boundary scan cells. The circuit 300 may allow a standard router to connect the I/O pins from one I/O device to another I/O device. The circuit 300 may allow a minimal amount of routing to be used and the hold time issue may be addressed per default. The circuit 300 may simplify the flow which saves time and area.

Figure 6:
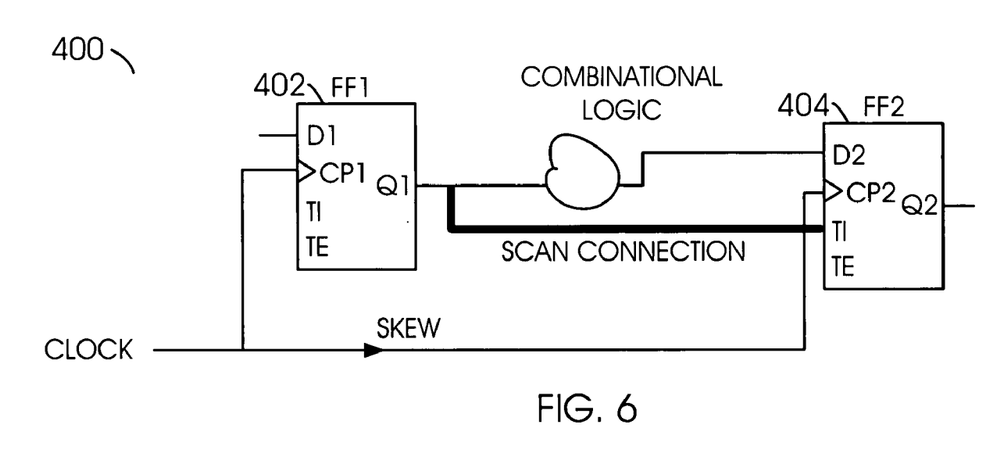
FIG. 6 is a block diagram of a typical scan connection.

Referring to FIG. 6, a typical scan net flip flop circuit 400 is shown. The flip flop circuit 400 can be implemented in the boundary scan cells 22. The circuit 400 comprises a flip flop 402 and a flip flop 404. The flip flops 402 and 404 may have a number of inputs (e.g., D, CP, TI and TE) and an output (e.g., Q). The flip flops 402 and 404 provide the same output (Q) for data and the scan chain. The output connected to the datapath is also connected to the scan out of the flip flop 402 in the scan chain. The entire scan chain (which may include a large number of interconnects) and the input capacitance of the scan data input (the input TI) switch unnecessarily in the functional mode. Additionally, since the datapath is loaded with the scan connection, speed and power consumption issues occur. Furthermore, the speed and the power consumption of the flip flops 402 and 404 is affected by the decoupling inverter in front of the clock input of the flip flop (discussed further in connection with FIGS. 8 and 9).

The flip flop 402 provides the same output for data and scan (e.g., the output Q1). The scan connection (the output Q1) always switches unnecessarily in functional mode. Typical flip flop implementations may provide a separate scan output, however, the scan output is not controlled by the scan enable (the input TE). The output therefore switches unnecessarily in the functional mode. Typical flip flop implementations consume unnecessarily too much power and need additional cooling and/or expensive heat sinking at the package level. Furthermore, the flip flops 402 and 404 do not provide the speed necessary for high performance applications. It is generally desirable to only switch the scan chain during the scan testing of the flip flops to reduce power consumption.

Figure 7:
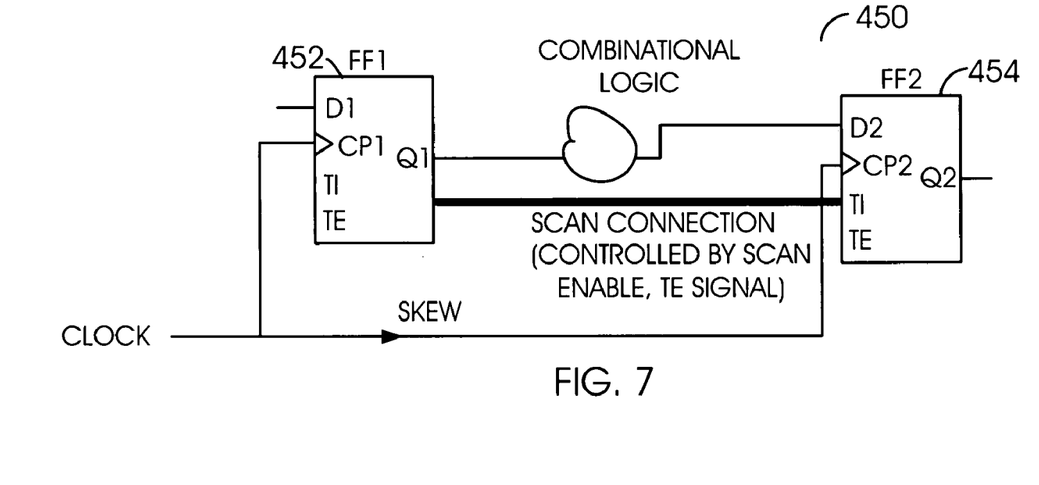
FIG. 7 is a block diagram of a scan connection in accordance with the present invention.

Referring to FIG. 7, a flip flop circuit 450 is shown in accordance with the present invention. The flip flop circuit 450 may be implemented in the boundary scan cells 304–310. However, the conventional boundary scan cells 22 may also benefit from the implementation of the flip flop 450. The flip flop circuit 450 may have improved speed and reduced power consumption over the circuit 400, without incurring an area penalty. A flip flop 452 may provide a separate scan output (e.g., SEO), where the scan output SEO is controlled by the scan enable pin TE. The output SEO and the output Q1 may be connected to a data input (e.g. D2) and a scan data input (e.g., TI), respectively, of a flip flop 454. Since the scan output SEO is disconnected from the data output Q1, the performance of the flip flop circuit 450 may increase. Since the scan output SEO is disconnected from the data output Q1, the power saving of the flip flop 452 may increase. Additionally, since the scan connection is quiet during the functional mode, the circuit 450 may not contribute to crosstalk and noise.

Figure 8:
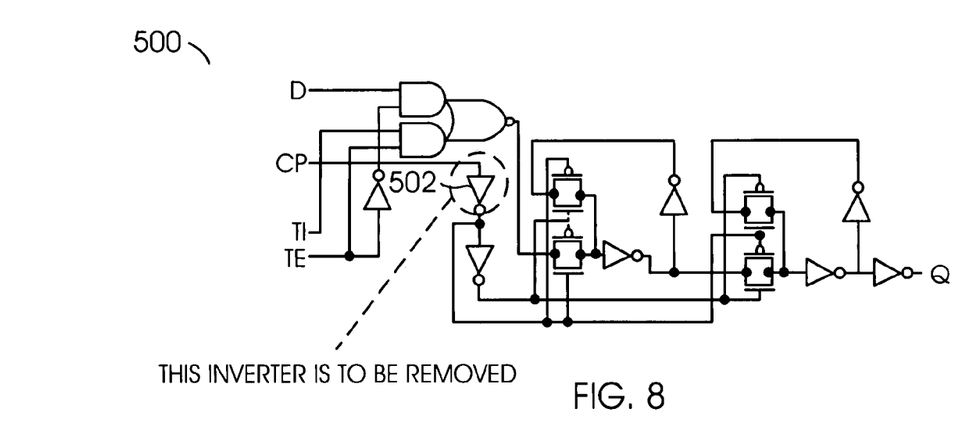
FIG. 8 is a block diagram of a typical scan flip flop.

Referring to FIG. 8, a typical flip flop 500 is shown. The flip flop circuit 500 can be implemented in the boundary scan cells 22. The flip flop 500 implements a decoupling inverter 502 at the clock input to protect the internal circuitry. The inverter 502 may protect from incoming clock signals that have large ramp times and cause very large and unpredictable flip flop delays. However, the inverter 502 switches with a clock frequency (e.g., CP) and contributes to power consumption. The inverter 502 also slows down the critical path, since it contributes to the overall data to clock pulse setup time. Because the clock tree has stringent ramp time requirement, removing the decoupling inverter 502 will not affect the functionality of the flip flop 500, since at low ramp time, the delay of the flip flop 500 is very predictable.

Figure 9:
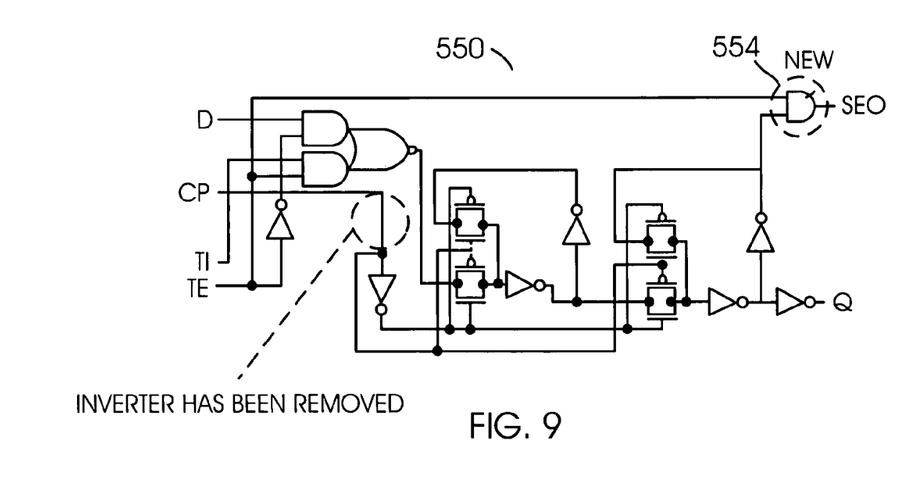
FIG. 9 is a block diagram of a scan flip flop in accordance with the present invention.

Referring to FIG. 9, a flip flop circuit 550 is shown. The flip flop circuit 550 may be implemented in the boundary scan cells 304–310. However, the conventional boundary scan cells 22 may also benefit from the implementation of the flip flop circuit 550. The circuit 550 may be implemented without the inverter 502. The flip flop circuit 554 may provide significant power savings since the inverter 502 is removed. The setup time of the flip flop circuit 550 may be reduced by removing the delay through the inverter 502. The flip flop circuit 550 may have an area savings (e.g., the area of the inverter 502). The area needed for an additional gate 504 (e.g., a NAND gate) may be compensated by the area saved from the input inverter 502. The flip flop circuit 550 may have improved performance and have a power savings when compared with the circuit of FIG. 8. The flip flop circuit 550 may reduce crosstalk and noise impact of the scan connection (through reduction of the load at the data output, and reduction of the setup time through the removal of the decoupling inverter). The flip flop circuit 550 may also provide reduction of the switching capacitance on the clock tree (in a conventional circuit such as the circuit 20) and reduction of the switching load at the output of the flip flop, since the entire scan chain is quiet during the functional mode.

The circuit 550 may provide a scan flip flop with scan enable controlled scan output and reduced setup time. The flip flop circuit 550 may have a separate scan output SEO which may be controlled by the scan enable pin TE. Furthermore, the scan output SEO may not switch during the functional mode. The scan output SEO may have a weak driver, whereas the data output Q may have variable driven strength driver. Such a configuration may save power and also not contribute to crosstalk and noise, since the entire scan chain may be quiet. With reduced load on the data output Q, the CP-to-Q path may be faster.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   one or more groups of boundary scan cells;
   one or more group buffers coupled to each of said groups of boundary scan cells;
   one or more repeater buffers coupled in series with said group buffers;
   a controller coupled to said groups of boundary scan cells through said group buffers and said repeater buffers, wherein (i) said apparatus is configured to buffer said groups of boundary scan cells to reflect an order of I/Os around said apparatus and (ii) said groups of boundary scan cells are routed within an I/O portion of said apparatus to avoid routing through an interior portion of said apparatus to keep said interior portion free for functional routing;

one or more flip flops each configured to provide a scan enable output; and a scan enable signal configured to control a scan connection between each of said flip flops.

2. The apparatus according to claim 1, wherein said groups of boundary scan cells comprise a scan chain.

3. The apparatus according to claim 2, wherein said repeater buffers are configured to eliminate skew at the beginning pins and end pins of the scan chain.

4. The apparatus according to claim 1, wherein said apparatus further comprises:

one or more boundary scan control nets configured to control said groups of boundary scan cells.

5. The apparatus according to claim 1, wherein each boundary scan cell of said groups of boundary scan cells are implemented within an I/O cell.

6. The apparatus according to claim 1, wherein said apparatus comprises a clock chain in a first direction and a data path in an opposite direction of said first direction.

7. An apparatus comprising:

means for implementing one or more groups of boundary scan cells;

means for implementing one or more group buffers coupled to each one of said groups of boundary scan cells;

means for implementing one or more repeater buffers coupled in series with said group buffers; and means for controlling coupled to said groups of boundary scan cells through said group buffers and said repeater buffers;

means for buffering said groups of boundary scan cells to reflect an order of I/Os around said apparatus, wherein said groups of boundary scan cells are routed within an I/O portion of said apparatus to avoid routing through an interior portion of said apparatus to keep said interior portion free for functional routing;

means for providing a scan enable output; and means for controlling a scan connection between one or more flip flops.

8. A method for optimizing buffers for JTAG boundary scan nets, comprising the steps of:

(A) reading a netlist;

(B) reading an I/O order list;

(C) defining a number of I/Os per groups;

(D) determining if a last I/O is connected;

(E) writing a final netlist; and (F) determining if starting a new group is necessary.

9. The method according to claim 8, wherein step (D) further comprises:

splitting a net.

10. The method according to claim 9, wherein step (D) further comprises:

inserting a repeater buffer.

11. The method according to claim 10, wherein step (D) further comprises:

inserting a group buffer.

12. The method according to claim 8, wherein step (D) further comprises:

connecting a next I/O to a newest group buffer.

13. The method according to claim 8, further comprising the following step:

repeating step (D).

14. The method according to claim 8, wherein step (E) further comprises:

buffering said JTAG boundary scan nets to reflect the order of I/O cells around a circuit.

15. The method according to claim 8, wherein steps (E) further comprises:

providing boundary scan cell placement.

16. The method according to claim 8, wherein step (E) further comprises:

allowing optimum results to be obtained automatically.

* * * * *